(12) United States Patent
Maeno et al.

(10) Patent No.: US 7,265,396 B2
(45) Date of Patent: Sep. 4, 2007

(54) SEMICONDUCTOR DEVICE

(75) Inventors: Muneaki Maeno, Kanagawa-ken (JP); Toshiki Morimoto, Kanagawa-ken (JP); Hiroaki Suzuki, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 61 days.

(21) Appl. No.: 11/027,058

(22) Filed: Dec. 29, 2004

(65) Prior Publication Data

US 2005/0145887 A1    Jul. 7, 2005

(30) Foreign Application Priority Data

Jan. 7, 2004    (JP) .......................... P2004-001721

(51) Int. Cl.
*H01L 27/10*    (2006.01)
(52) U.S. Cl. ................... 257/208; 257/203; 257/209; 257/210; 257/211
(58) Field of Classification Search ............... 257/603, 257/203, 208, 209, 210, 211
See application file for complete search history.

(56) References Cited

U.S. PATENT DOCUMENTS

| | | | |
|---|---|---|---|
| 5,929,469 A | * | 7/1999 | Mimoto et al. ............. 257/208 |
| 6,525,350 B1 | | 2/2003 | Kinoshita et al. |
| 6,617,621 B1 | | 9/2003 | Gheewala et al. |

FOREIGN PATENT DOCUMENTS

| | | |
|---|---|---|
| JP | PH6-188397 | 7/1994 |
| JP | PH8-18021 | 1/1996 |
| JP | PH8-51194 | 2/1996 |
| JP | 3527483 | 2/2004 |

* cited by examiner

*Primary Examiner*—Douglas M. Menz
(74) *Attorney, Agent, or Firm*—DLA Piper US LLP

(57) ABSTRACT

A basic cell placed in a semiconductor device comprises a via contact placed on a wiring grid having a pitch narrower than a pitch between a contact placed in a source region and a contact placed in a drain region of a transistor in a basic cell, and a wiring layer connected to the via contact, being used as a source terminal, a drain terminal, and a gate terminal of the transistor.

5 Claims, 20 Drawing Sheets

SEMICONDUCTOR DEVICE

CROSS REFERENCE TO RELATED APPLICATION

This application is based upon and claims the benefit of the prior Japanese Patent Application No. 2004-1721, filed on Jan. 7, 2004; the entire contents of which are incorporated herein by reference.

FIELD OF THE INVENTION

This invention relates to a semiconductor device, especially a master slice semiconductor integrated circuit, such as a gate array or an embedded array.

DESCRIPTION OF THE BACKGROUND

A fabrication of a master slice semiconductor integrated circuit, such as a gate array or an embedded array, has usually two phases which are called a pre design phase and a post design phase. In a pre design phase, a large number of transistors are fabricated ahead of design completion. And, in a post design phase, transistors are interconnected using metal wires which allow the semiconductor devices to meet each customer's specific requirements after design completion. In a master slice semiconductor integrated circuit, transistors are regularly arranged in a number of unit groups called basic cells each having several transistors.

Miniaturization of wiring has been made progress faster than miniaturization of a transistor in Deep submicron LSI in recent years. It is difficult thereby, to connect a wiring in a basic cell to external wiring freely in a master slice semiconductor integrated circuit.

Japanese Patent Laid Open No. H8-51194 describes a semiconductor integrated circuit using the first layer metal wiring on a field of a basic cell for connection with external wiring, or preparing the first layer via contact in a place distant from a contact in a transistor of a basic cell.

However, such a semiconductor integrated circuit has a problem that there is limit to position of terminals being used for connection to external wirings in a basic cell. Also there is a problem that compaction of a basic cell is difficult.

Japanese Patent Laid Open No. H8-18021 describes a master slice semiconductor integrated circuit arranging a low threshold voltage cell array adjoining a high threshold voltage cell array for low voltage operation. And, Japanese Patent Laid Open No. H6-188397 describes a master slice semiconductor integrated circuit preparing a special cell array which constitutes sequential circuits, such as flip flops, to prevent a clock skew problem.

These approaches have a problem that a placement position of a cell array for low threshold voltage or sequential circuits was being fixed.

SUMMARY OF THE INVENTION

One aspect of the present invention is to provide a semiconductor device including arrays of basic cells that each basic cell comprises a transistor having a source region, and a drain region spaced from the source region, and a gate electrode placed between the source region and the drain region, a first contact area placed in the source region, a second contact area placed in the drain region, and a third contact area placed in the gate electrode, a plurality of via contact areas placed on imaginary points corresponding to wiring grids for layout design, having a pitch narrower than a pitch between the first contact area and the second contact area, and a wiring layer including a first wiring portion connecting the first contact area to a first one of via contact areas as a source terminal of the transistor, a second wiring portion connecting the second contact area to a second one of via contact areas as a drain terminal of the transistor, and a third wiring portion connecting the third contact area to a third one of via contact areas as a gate terminal of the transistor.

Another aspect of the present invention is to provide a semiconductor device including arrays of basic cells that each basic cell comprises a transistor having a source region, and a drain region spaced from the source region, and a gate electrode placed between the source region and the drain region, a first contact area placed in the source region, a second contact area placed in the drain region, and a third contact area placed in the gate electrode, a plurality of first layer via contact areas in a same pitch as a pitch between the first contact area and the second contact area, a first wiring layer connecting one of the contact areas to one of the first layer via contact areas, a plurality of second layer via contact areas arranged on imaginary points corresponding to wiring grids for layout design, having a pitch narrower than a pitch between the first contact area and the second contact area, and a second wiring layer provided in upper layer of the first wiring layer, including a first wiring portion connecting the first contact area to a first one of via contact areas as a source terminal of the transistor, a second wiring portion connecting the second contact area to a second one of via contact areas as a drain terminal of the transistor, and a third wiring portion connecting the third contact area to the one of via contact areas as a gate terminal of the transistor.

DETAILED DESCRIPTION OF THE EMBODIMENTS

Exemplary embodiments of the present invention will be explained in reference to the drawings.

Figure 1:
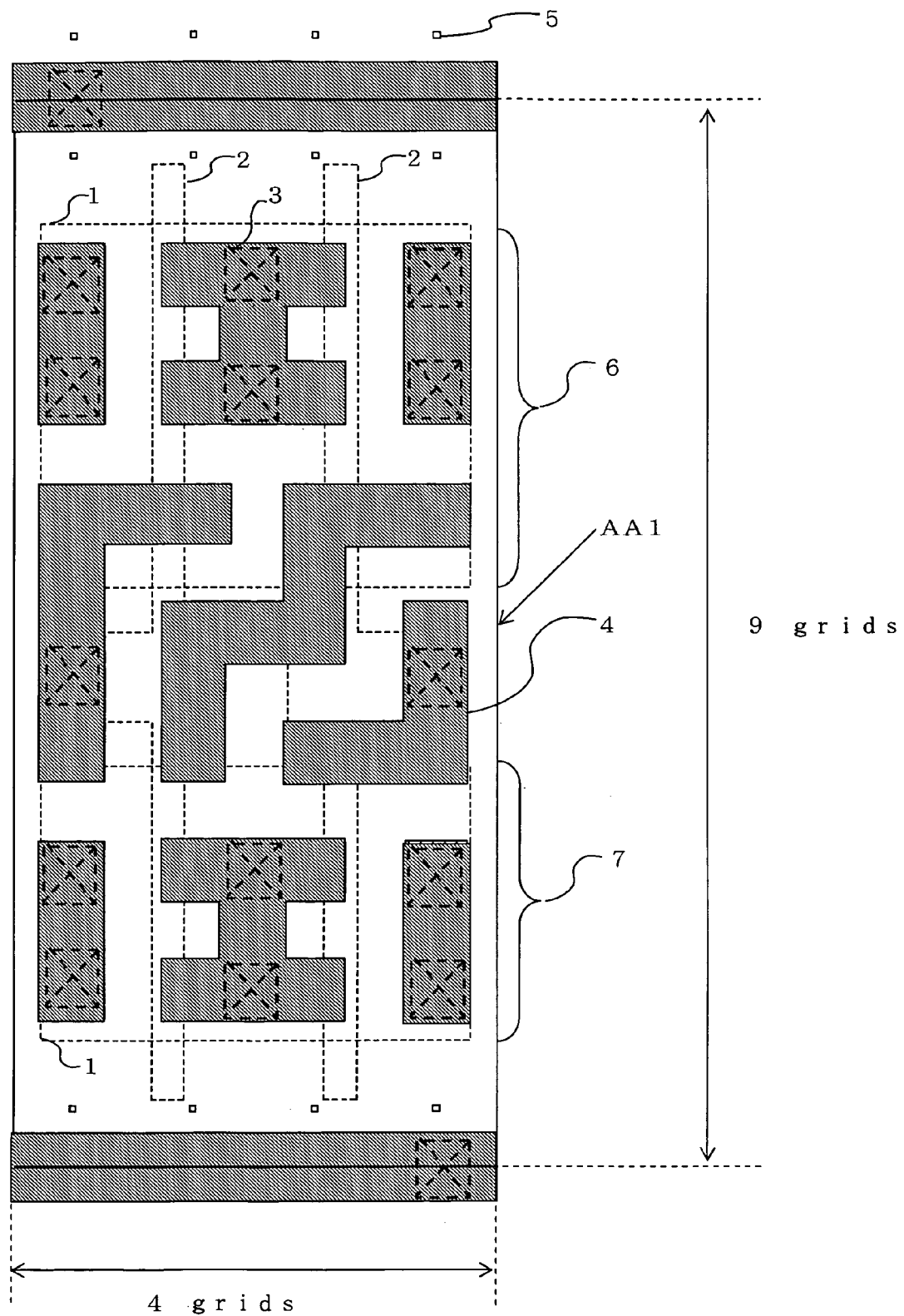
FIG. 1 is a plane view showing a basic cell of a semiconductor device according to a first embodiment of the present invention.

FIG. 1 is a plane view showing basic cell AA1 of a semiconductor device according to a first embodiment of the present invention.

Basic cell AA1 of the semiconductor device of this embodiment includes diffusion areas 1, polysilicon layers 2, contacts 3, and first layer wirings 4. Contacts 3 are formed in P-channel MOS transistor region 6 and N-channel MOS transistor region 7, and covered with first layer wirings 4. Grid 5 which is the imaginary point of being used in a layout design is a unit of placement and routing of a master slice semiconductor integrated circuit, and the size of a basic cell is expressed using grid 5. In this embodiment, basic cell AA1 has nine grids height and four grids width.

Figure 2:
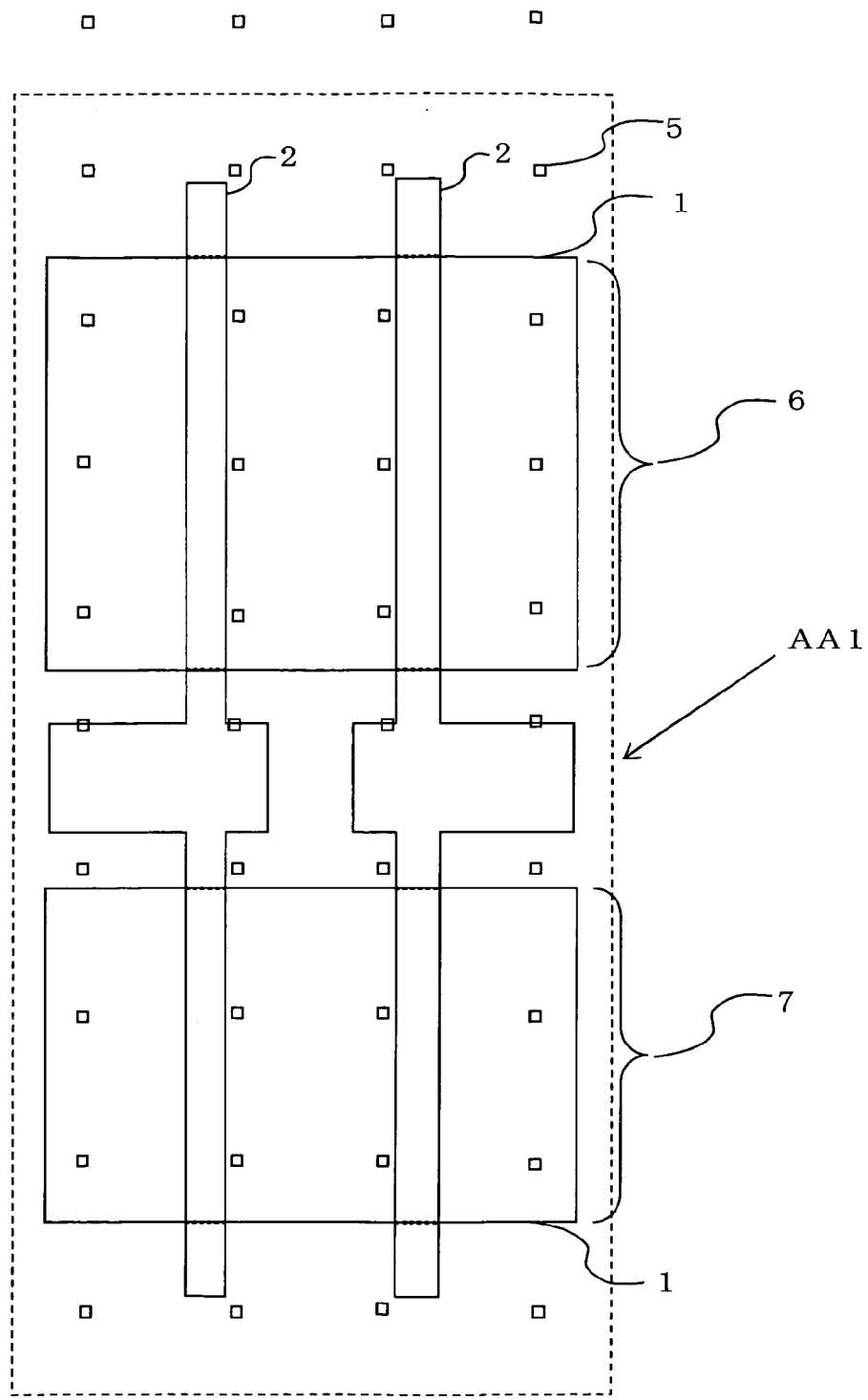
FIG. 2 is a plane view showing a diffusion area and a polysilicon layer of the basic cell of the semiconductor device according to the first embodiment of the present invention.

FIG. 2 is a plane view showing diffusion areas and polysilicon layers of basic cell AA1.

Each diffusion area 1 forms P-channel MOS transistor region 6 and N-channel MOS transistor region 7 respectively. Each polysilicon layer 2 is formed to divide P-channel MOS transistor region 6 and N-channel MOS transistor region 7 into three portions, respectively. And polysilicon layer 2 forms a gate electrode of a P-channel MOS transistor and a gate electrode of an N-channel MOS transistor.

Each P-channel MOS transistor region 6 and N-channel MOS transistor region 7 is divided into a source region and a drain region which faced each other with the space of the width of polysilicon layer 2 being the gate electrode.

Figure 3:
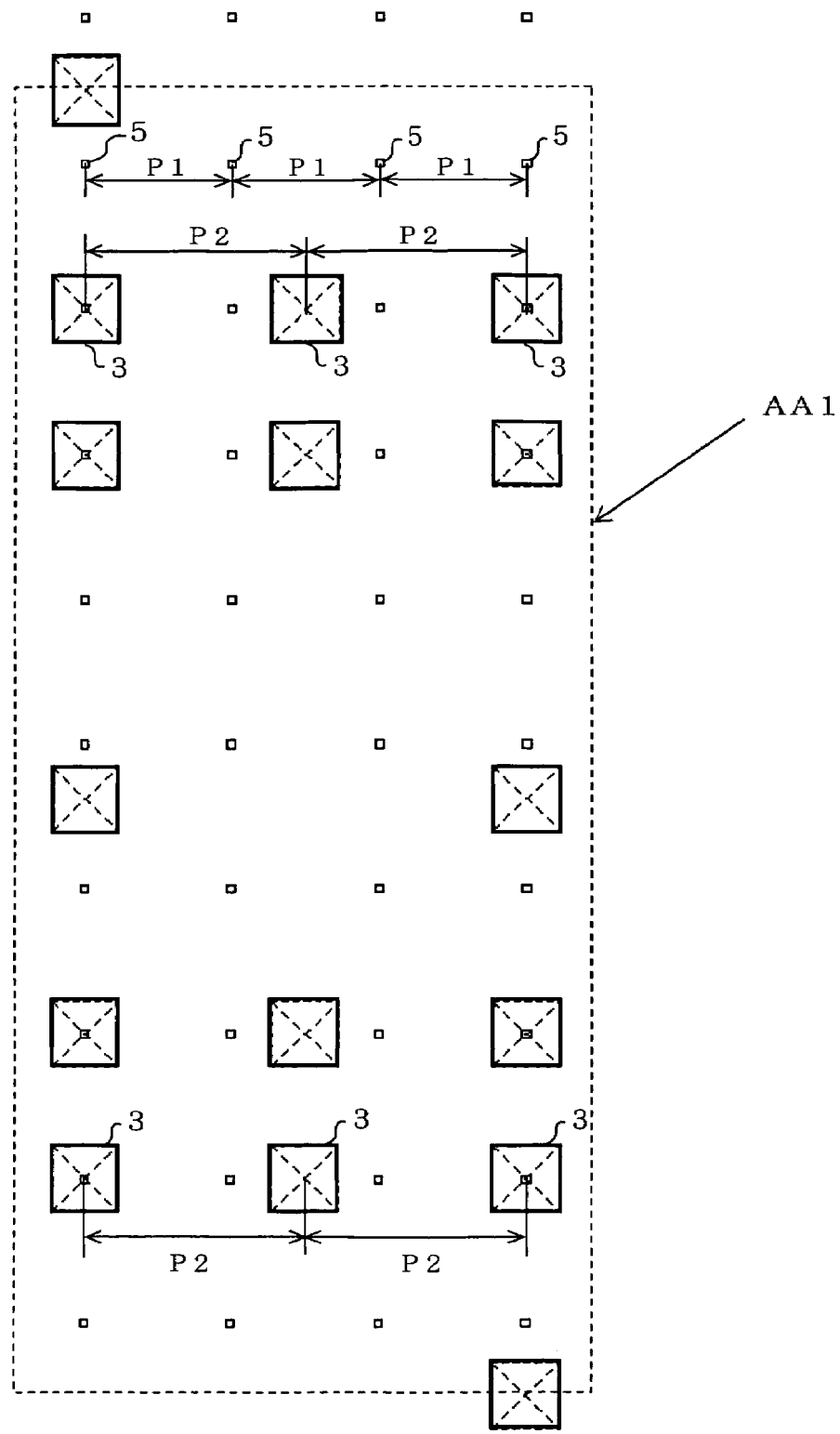
FIG. 3 is a plane view showing a contact layer of the basic cell of the semiconductor device according to the first embodiment of the present invention.

FIG. 3 is a plane view showing a contact layer of basic cell AA1, and showing a relation between pitch P1 of grids 5 and pitch P2 of contacts 3. As shown in FIG. 3, pitch P1 of grids 5 can be set up more narrowly than pitch P2 of contacts 3 placed in each divided portion of P-channel MOS transistor region 6 and N-channel MOS transistor region 7.

Figure 4:
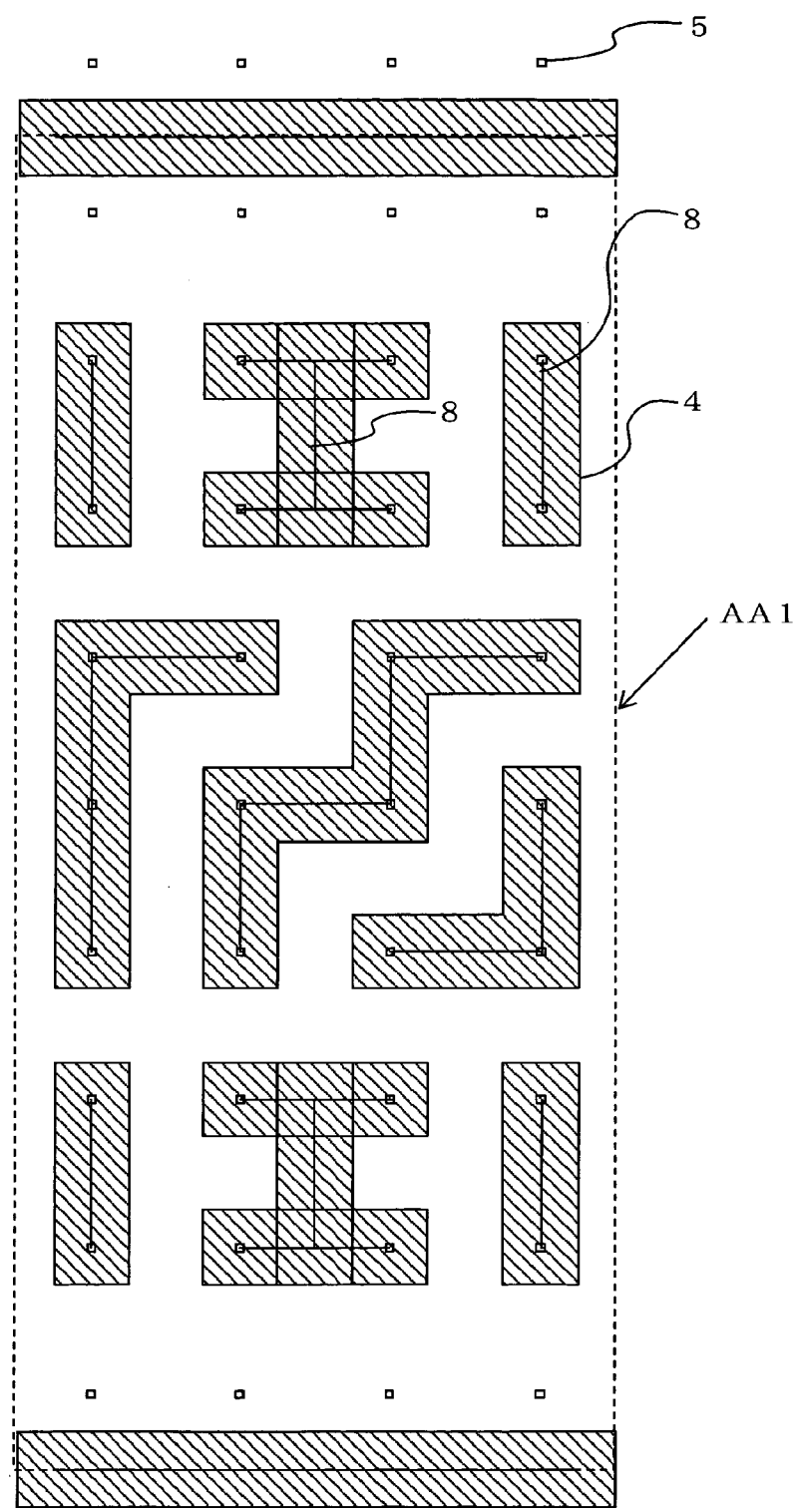
FIG. 4 is a plane view showing a first wiring layer of the basic cell of the semiconductor device according to the first embodiment of the present invention.

FIG. 4 is a plane view showing a first wiring layer of basic cell AA1. First layer wiring line symbols 8 are wired on grids 5 and contain contacts 3. First layer wirings 4 are automatically generated from data of first layer wiring line symbols 8. First layer wirings 4 are used as wiring terminals of gates, sources and drains of transistors.

Layout patterns of basic cell AA1 are fixed from diffusion areas 1 to first layer wirings 4. A logic circuit is formed by placing a first or more layer via contacts and a second or more layer wirings on first layer wirings 4.

In the width direction of basic cell AA1, three terminals are put on the diffusion area 1. On the other hand, four grids 5 are placed in the width direction. Therefore, semiconductor device can obtain many wiring resources compared with the previous design.

Figure 5:
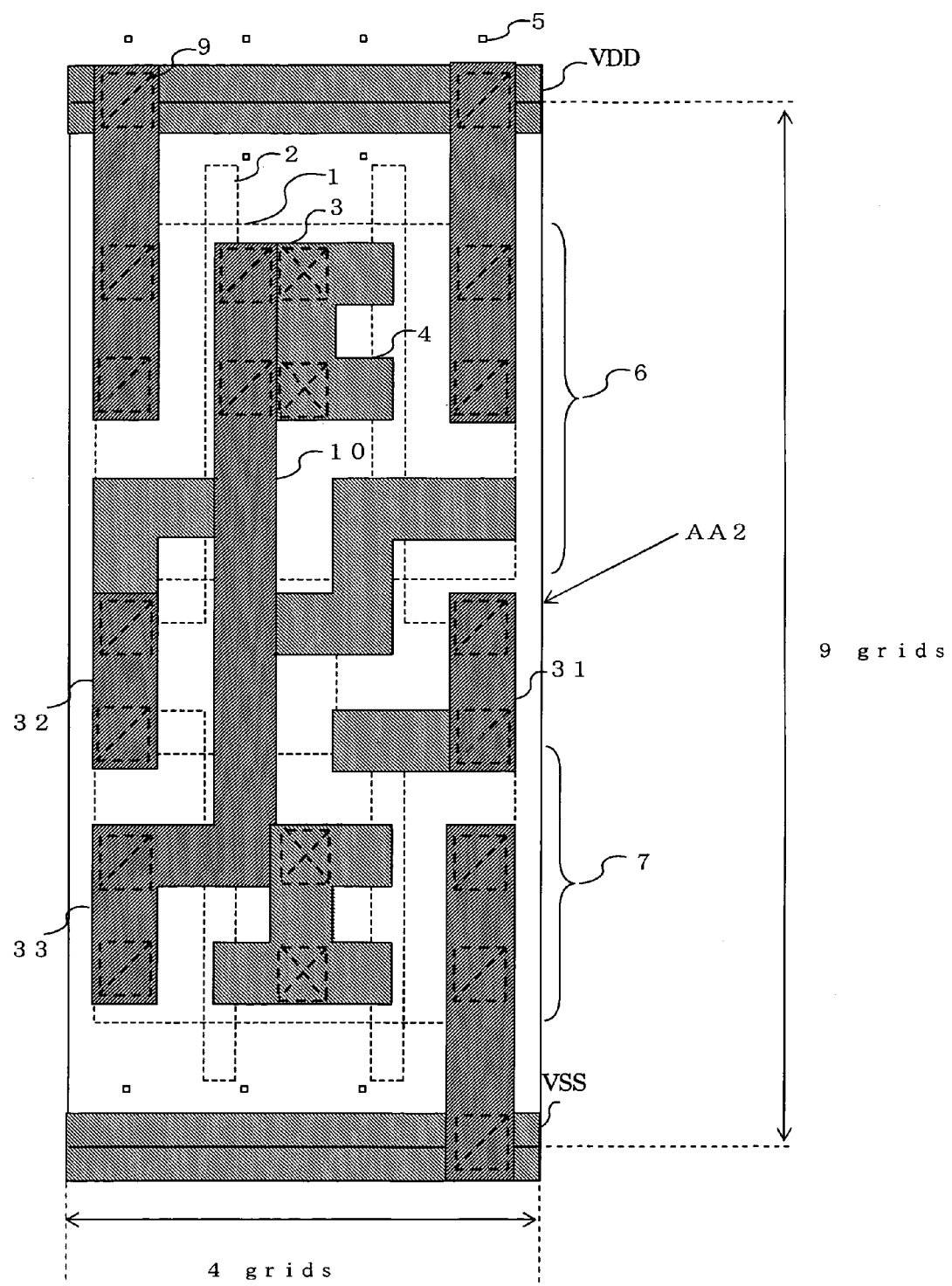
FIG. 5 is a plane view showing an example of a logic circuit using the basic cell of the semiconductor device according to the first embodiment of the present invention.

FIG. 5 shows a two-input NAND as an example of a logic circuit using basic cell AA1 shown in FIG. 1.

Two-input NAND cell AA2 shown in FIG. 5 including a layer of diffusion areas 1, polysilicon layers 2, contacts 3, first layer wirings 4, first layer via contacts 9 and second layer wirings 10, functions as a two-input NAND circuit which has two input parts 31 and 32 and one output part 33.

Figure 6:
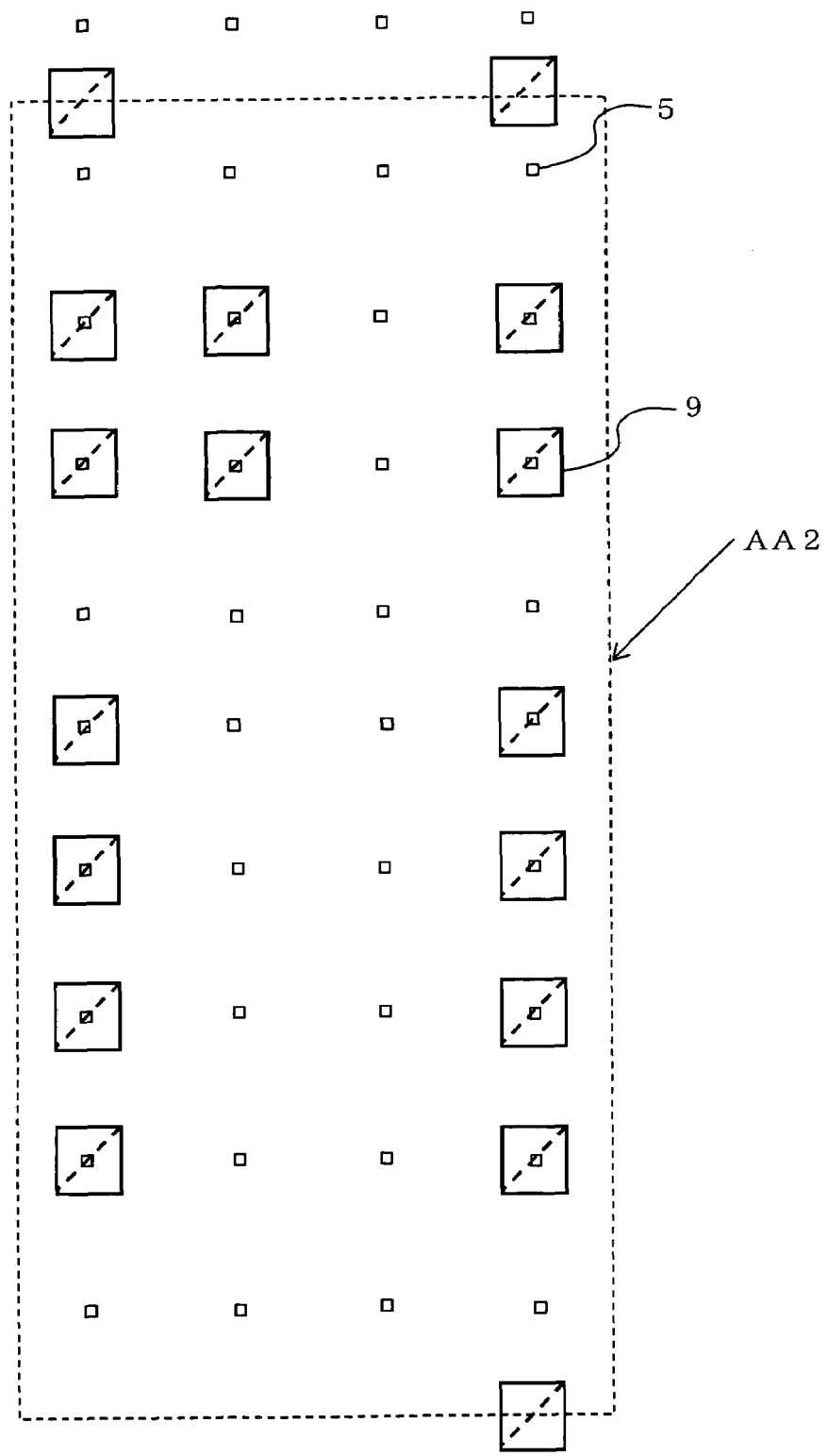
FIG. 6 is a plane view showing a first via contact layer of the basic cell of the semiconductor device according to the first embodiment of the present invention.
Figure 7:
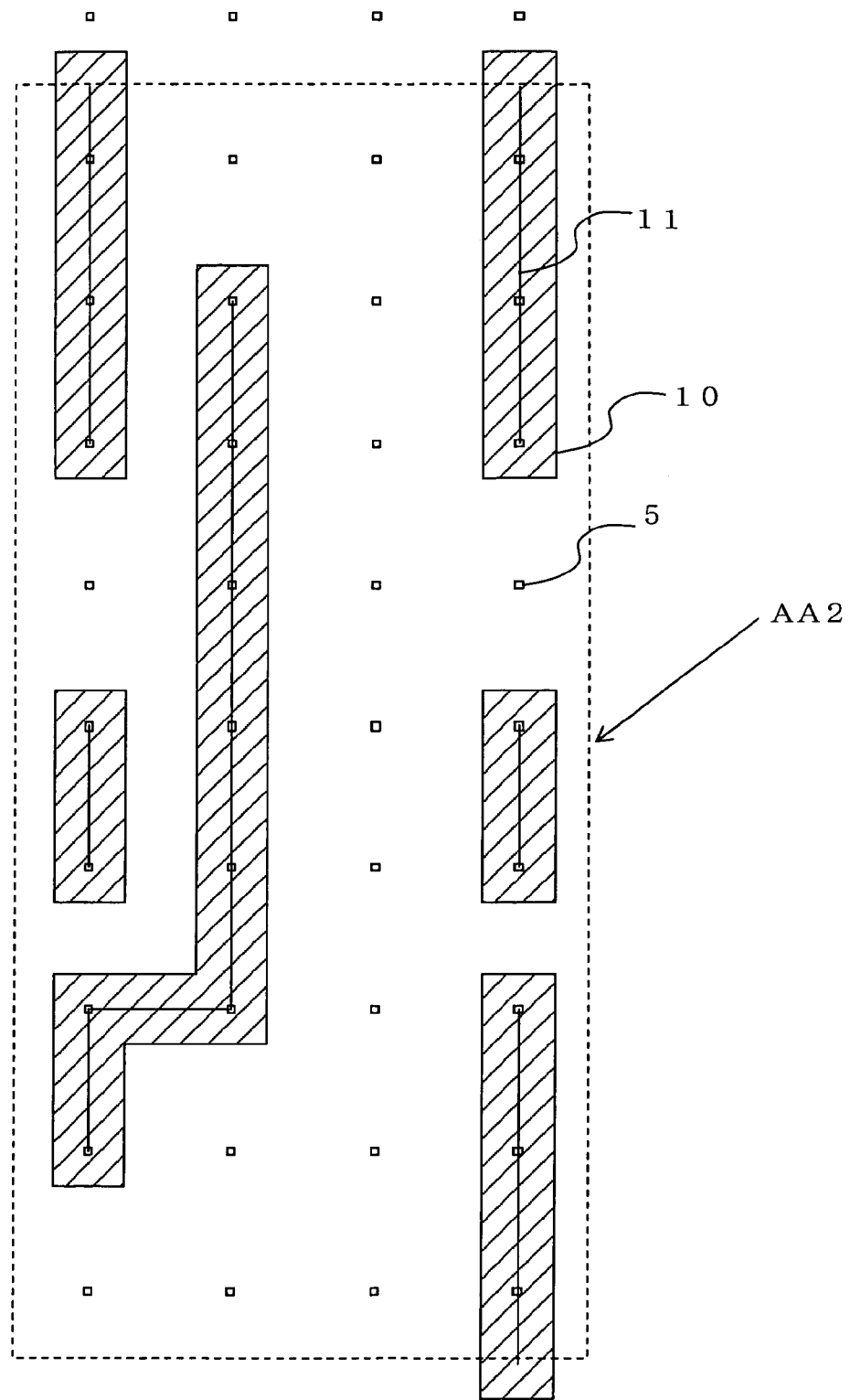
FIG. 7 is a plane view showing a second wiring layer of the basic cell of the semiconductor device according to the first embodiment of the present invention.

FIG. 6 is a plane view showing a first via contact layer of a basic cell of this embodiment, and FIG. 7 is a plane view showing a second wiring layer of a basic cell of this embodiment. Two-input NAND cell AA2 has the same layer composition from diffusion areas 1 to first layer wirings 4 and same patterns as FIG. 1.

As shown in FIG. 6, first layer via contacts 9 are placed on grids 5.

As shown in FIG. 7, second layer wiring line symbols 11 is also wired on grids 5. Second layer wirings 10 are automatically generated from data of second layer wiring line symbols 11.

Since second layer wirings 10 in two-input NAND cell AA2 are wired on grids 5, second layer wirings 10 are connected with first layer wirings 4 which form the gate, the source and the drain terminal of the transistor through first via contact 9 placed on grids 5 respectively.

Thereby, it is possible to connect input parts 31 and 32 and an output part 33 of the two-input NAND circuit with external wirings wired on grids 5.

Figure 8:
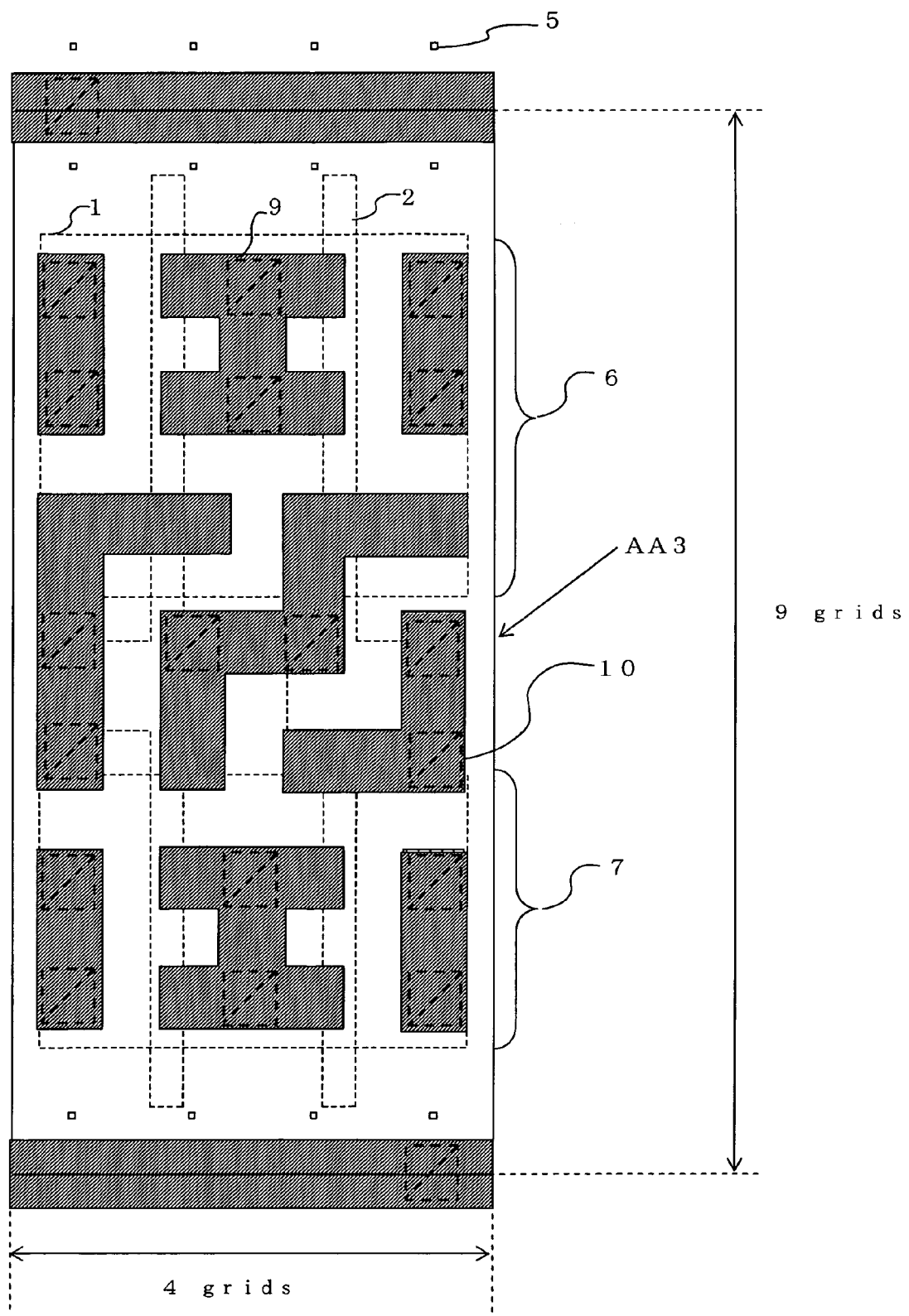
FIG. 8 is a plane view showing a basic cell of a semiconductor device according to a second embodiment of the present invention.

FIG. 8 is a plane view showing basic cell AA3 of a semiconductor device according to a second embodiment of the present invention.

With respect to each portion of this second embodiment, the same portion of the first embodiment shown in FIG. 1 is designated by the same reference numeral, and its explanation is omitted, and only a different portion will be explained.

Basic cell AA3 of the semiconductor device of this embodiment includes diffusion areas 1, polysilicon layers 2, contacts 3, first layer wirings 4, first layer via contacts 9, and second layer wirings 10. A size of basic cell AA3 is also nine grids height and four grids width.

Figure 9:
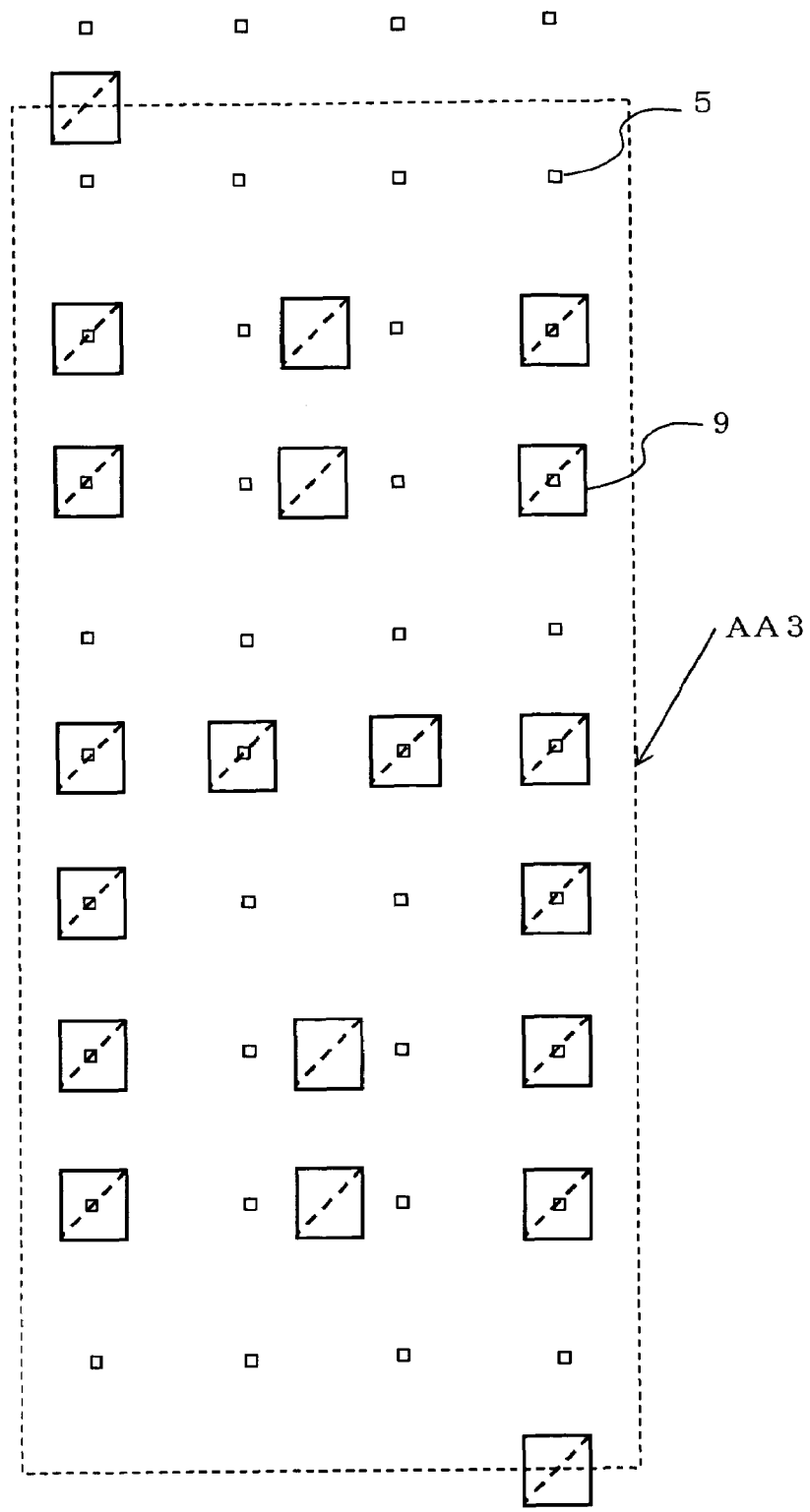
FIG. 9 is a plane view showing a first via contact layer of the basic cell of the semiconductor device according to the second embodiment of the present invention.
Figure 10:
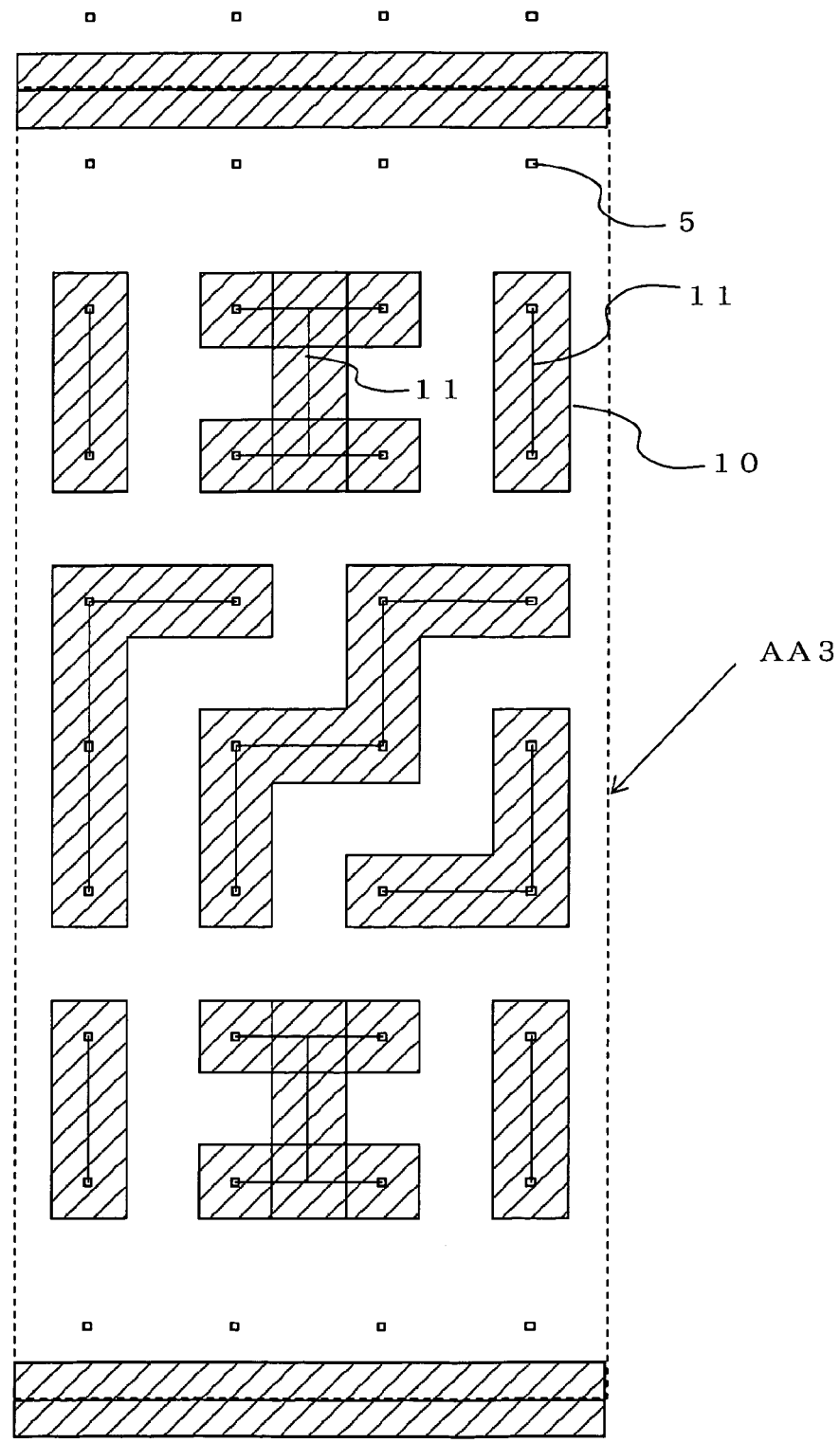
FIG. 10 is a plane view showing a second wiring layer of the basic cell of the semiconductor device according to the second embodiment of the present invention.

FIG. 9 is a plane view showing a first via contact layer of basic cell AA3, and FIG. 10 is a plane view showing a second wiring layer of basic cell AA3. Basic cell AA3 has the same layer composition and arrangement from diffusion areas 1 to first layer wirings 4 as the first embodiment.

As shown in FIG. 9, first via contacts 9 are placed to connect each first layer wiring 4 to each second layer wiring 10.

As shown in FIG. 10, second layer wiring line symbol 11 connects grid 5 to other grid 5. Second layer wirings 10 are automatically generated from data of second layer wiring line symbols 11. Second layer wirings 10 are placed in the same places as first layer wirings 4 of the first embodiment.

Layout patterns of basic cell AA3 are fixed from diffusion areas 1 to second layer wirings 10. In order to form a logic circuit, a second or more layer via contact and a third or more layer wiring are placed on second layer wiring 10.

Second layer wiring 10 in basic cell AA3 connects grid 5 to other grid 5 in the semiconductor device of this embodiment. External wirings connected to basic cell AA3 are also wired on grids 5. Thus second layer wiring 10 in basic cell AA3 can be connected to external wiring without limitation of a connection place. Therefore, various logic circuits can be designed by changing a wiring after the third layer wiring by using basic cell AA3 as a basic design unit.

In the width direction of basic cell AA3, three terminals are put on the diffusion area 1 like the first embodiment. On the other hand, four grids 5 are placed in the width direction. Therefore, semiconductor device can obtain many wiring resources compared with the previous design.

Figure 11:
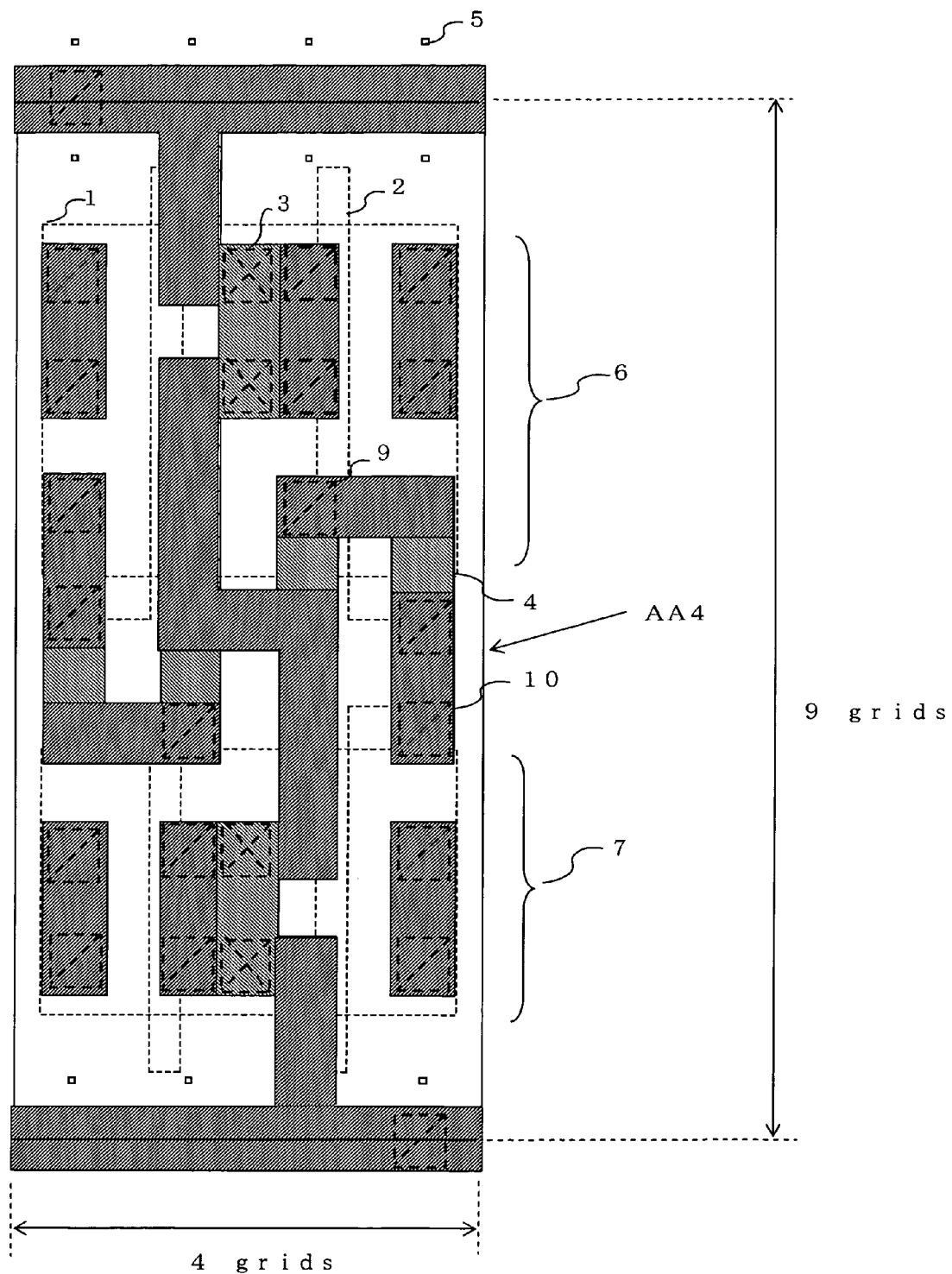
FIG. 11 is a plane view showing a basic cell of a semiconductor device according to a third embodiment of the present invention.

FIG. 11 is a plane view showing basic cell AA4 of a semiconductor device according to a third embodiment of the present invention. With respect to each portion of this third embodiment, the same portion of the first embodiment shown in FIG. 1 is designated by the same reference numeral, and its explanation is omitted, and only a different portion will be explained.

Basic cell AA4 of the semiconductor device of this embodiment includes diffusion areas 1, polysilicon layers 2, contacts 3, first layer wirings 4, first layer via contacts 9 and second layer wirings 10. A size of basic cell AA4 is also nine grids height and four grids width.

Figure 12:
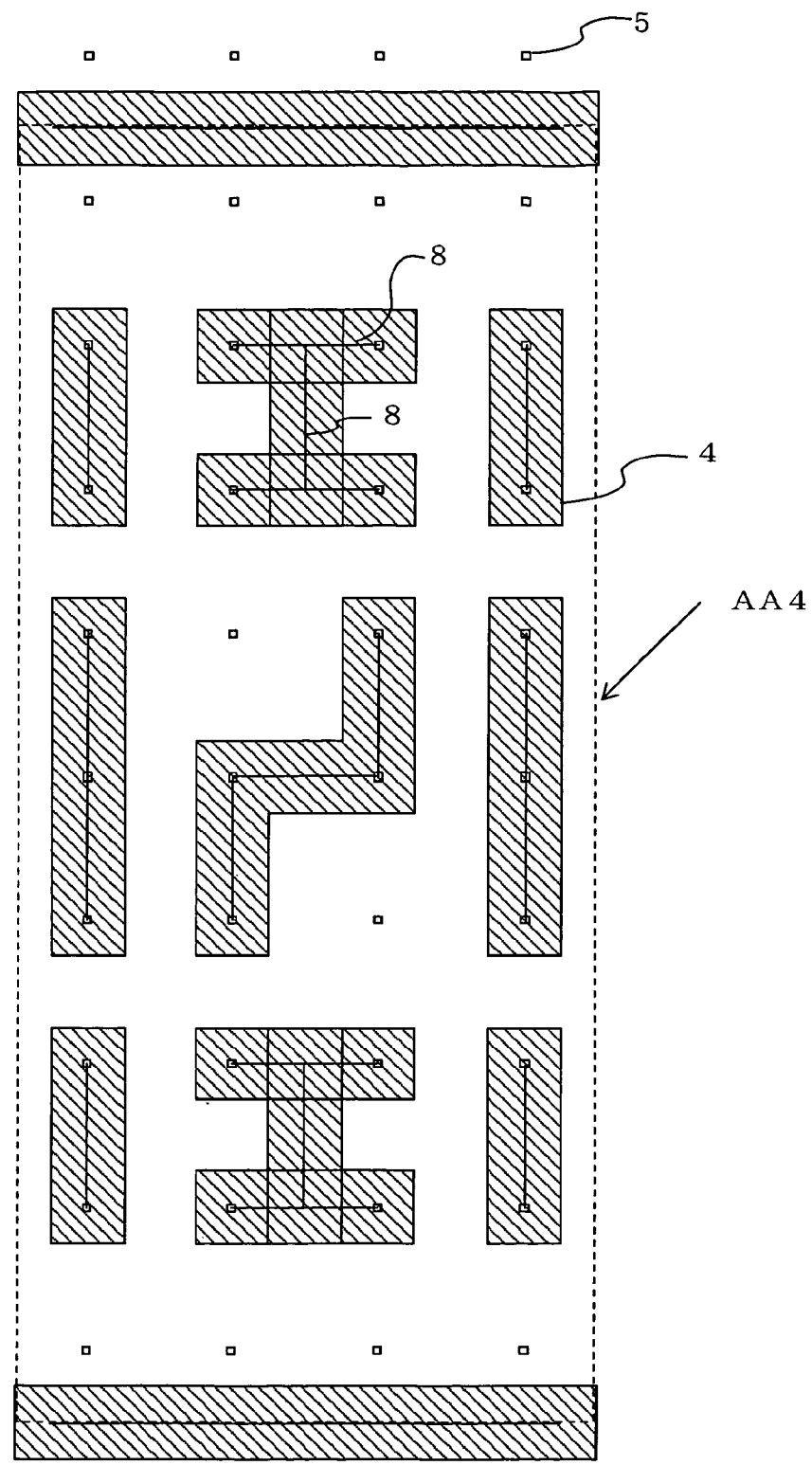
FIG. 12 is a plane view showing a first wiring layer of the basic cell of the semiconductor device according to the third embodiment of the present invention.
Figure 13:
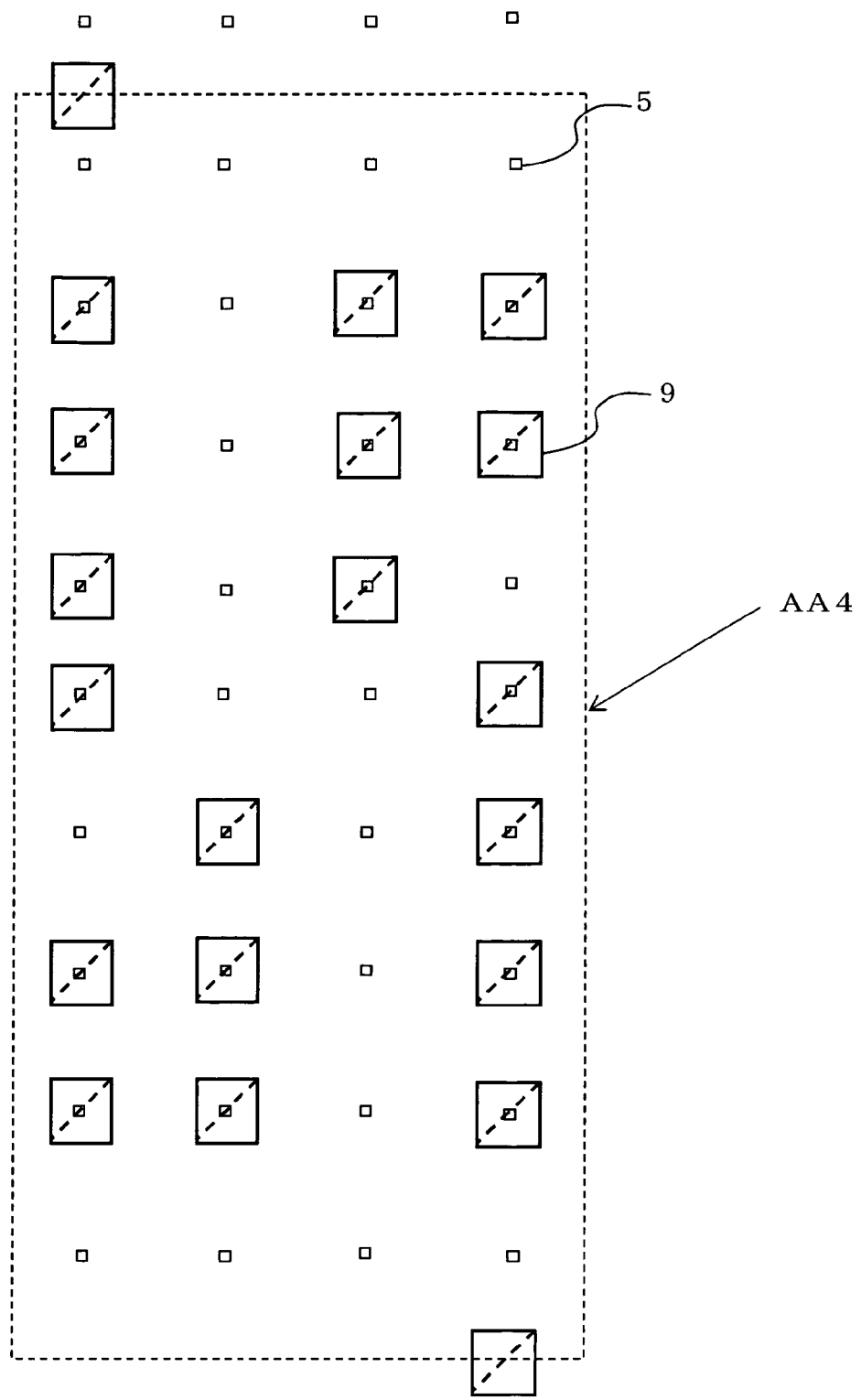
FIG. 13 is a plane view showing a first via contact layer of the basic cell of the semiconductor device according to the third embodiment of the present invention.
Figure 14:
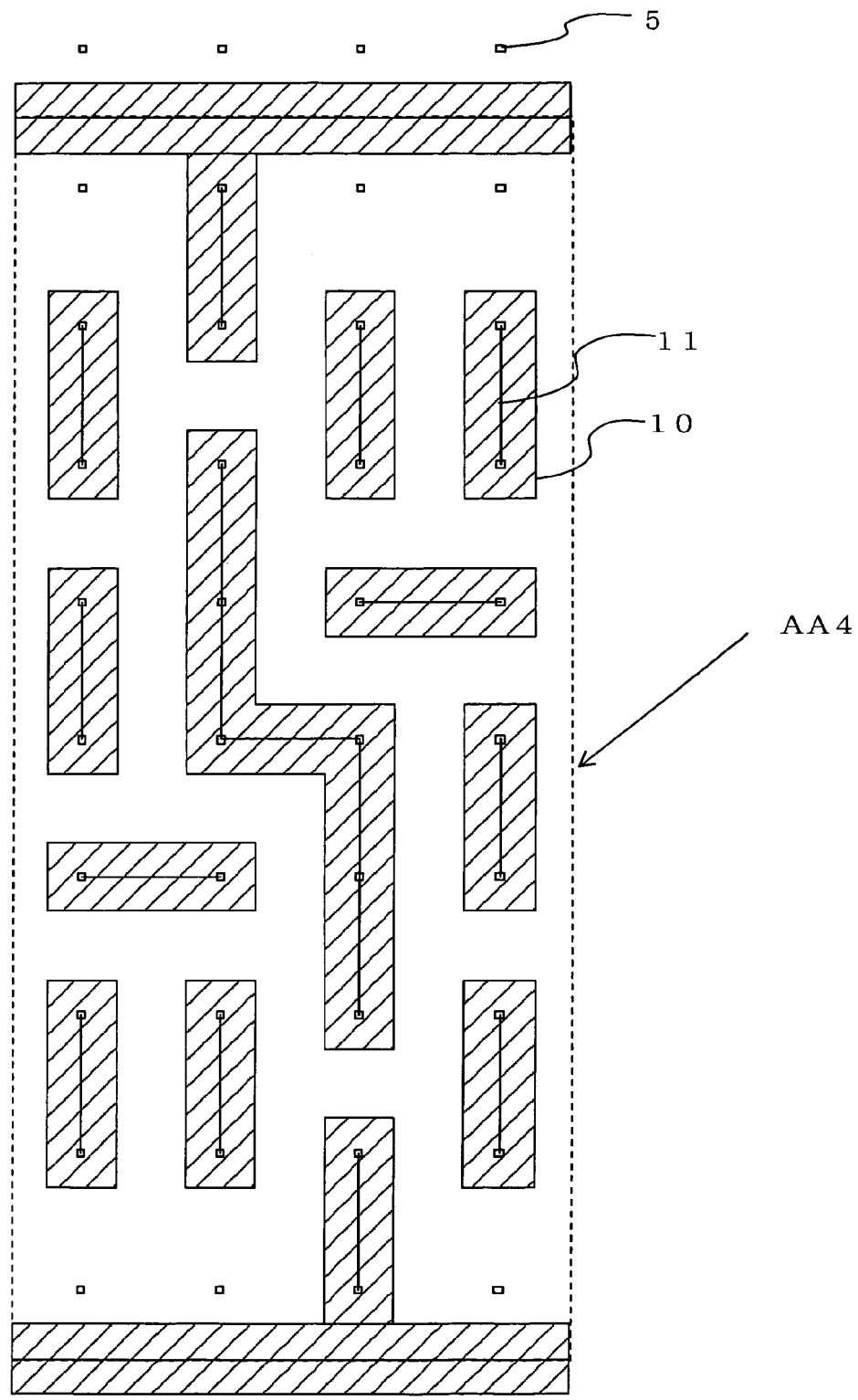
FIG. 14 is a plane view showing a second wiring layer of the basic cell of the semiconductor device according to the third embodiment of the present invention.

FIG. 12 is a plane view showing a first wiring layer of basic cell AA4, FIG. 13 is a plane view showing a first via contact layer of basic cell AA4, and FIG. 14 is a plane view showing a second wiring layer of basic cell AA4. Basic cell AA4 has the same layer composition and placement from diffusion areas 1 to contacts 3 as the first embodiment.

As shown in FIG. 12, first layer wiring line symbols 8 are wired on grids 5 and contain contacts 3 like the first embodiment. But, a placement place of first layer line symbols 8 differs from the first embodiment. First layer wirings 4 are automatically generated from data of first layer wiring line symbols 8.

As shown in FIG. 13, first layer via contacts 9 are placed by the same technique as the second embodiment. But, a placement place of first layer via contacts 9 differs from the second embodiment.

As shown in FIG. 14, second wiring line symbol 11 connects grid 5 to other grid 5. And second layer wiring 10 is formed by the same technique as the second embodiment. But, a placement place of second layer wirings 10 differs from the second embodiment.

Layout patterns of basic cell AA3 are fixed from diffusion areas 1 to second layer wirings 10. And, a second or more layer via contact and a third or more layer wiring are used for connecting to external wiring.

As mentioned above, second layer wirings 10 in basic cell AA4 are placed on grids 5 in the semiconductor device of this embodiment. Therefore basic cell AA4 can be connected to external wirings easily.

In the width direction of basic cell AA4, three terminals are put on the diffusion are 1 like the first embodiment. On the other hand, four grids 5 are placed in the width direction. Therefore, semiconductor device can obtain many wiring resources compared with the previous design.

Figure 15:
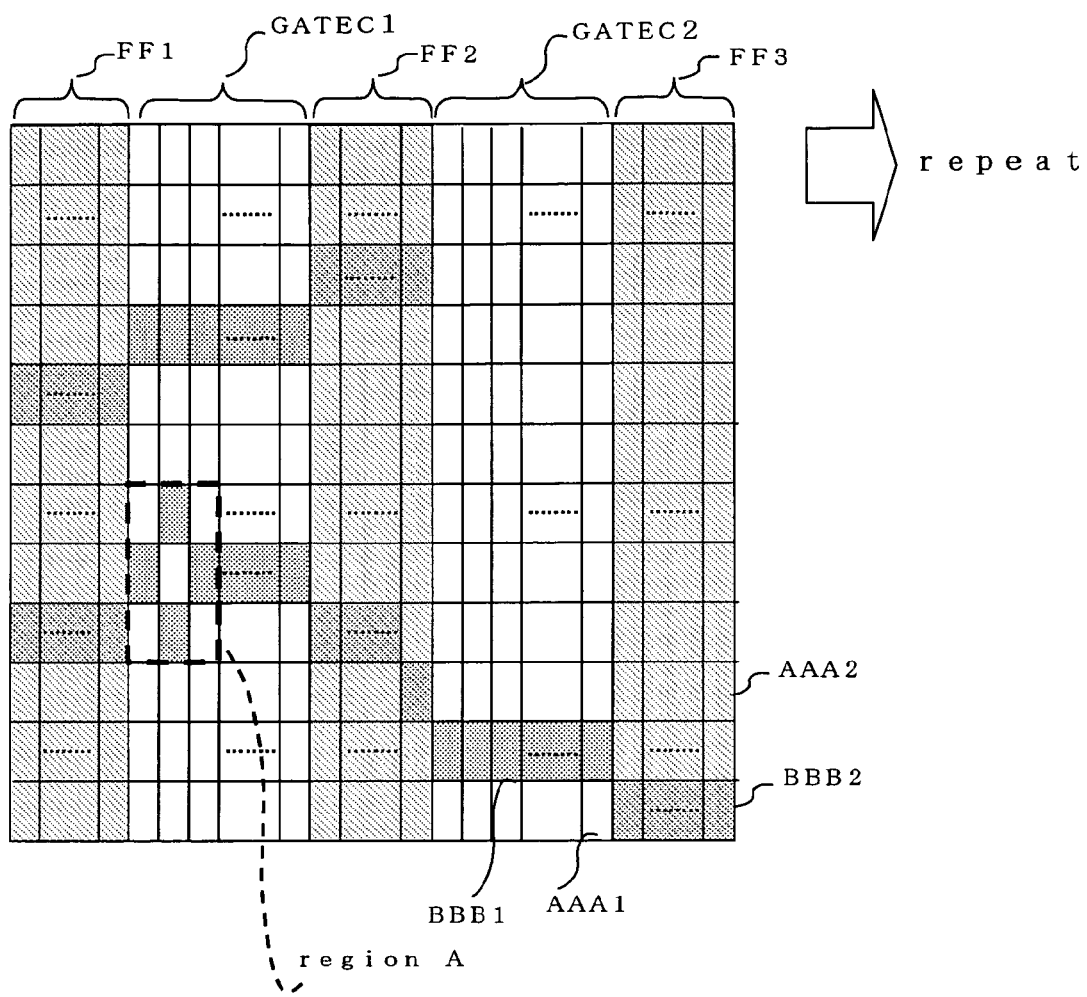
FIG. 15 is an outline figure showing a master slice semiconductor circuit chip using a semiconductor device according to a fourth embodiment of the present invention.

FIG. 15 is an outline figure showing a master slice semiconductor circuit chip using a semiconductor device according to a fourth embodiment of the present invention.

In FIG. 15, FF1, FF2, and FF3 express a sequential circuit, such as a flip flop, and GATEC1 and GATEC2 express a gate circuit which performs logic operation. The sequential circuits and the gate circuits are placed by turns in the LSI chip of the master slice semiconductor integrated circuit of this embodiment. Cells having the same size as the basic cell AA1, AA3 and AA4 explained in the first to the third embodiment are repeatedly placed in sequential circuits FF1, FF2, and FF3 and gate circuits GATEC1 and GATEC2. These cells have the same cell size as basic cell AA1, AA3, or AA4 explained in the first to third embodiment. However, the size of a sequential circuit tends to become larger than that of simple gate circuit such as an inverter. In that case, it is possible to create the basic cell for sequential circuits smaller than the basic cell used by the gate circuits.

Each sequential circuit FF1-FF3 has standard Vth cell AAA2 and high Vth cell BBB2. Standard Vth cell AAA2 contains P-channel MOS transistor whose threshold voltage is about −0.4V, and N-channel MOS transistor whose threshold voltage is about 0.4V. And, high Vth cell BBB2 contains P-channel MOS transistor whose threshold voltage is about −0.6V, and N-channel MOS transistor whose threshold voltage is about 0.6V.

On the other hand, each gate circuit GATEC1, GATEC2 has standard Vth cell AAA1 and high Vth cell BBB1. Here, standard Vth cell AAA1 contains P-channel MOS transistor whose threshold voltage is about −0.4V, and N-channel MOS transistor whose threshold voltage is about 0.4V. And, high Vth cell BBB1 contains P-channel MOS transistor whose threshold voltage is about −0.6V, and N-channel MOS transistor whose threshold voltage is about 0.6V. Here, high Vth cells BBB1 and BBB2 are used in order to reduce consumption current of LSI of the master slice semiconductor integrated circuit.

A layer composition of a basic cell of a semiconductor device will be explained with reference to a portion of a region A shown in FIG. 15.

Figure 16:
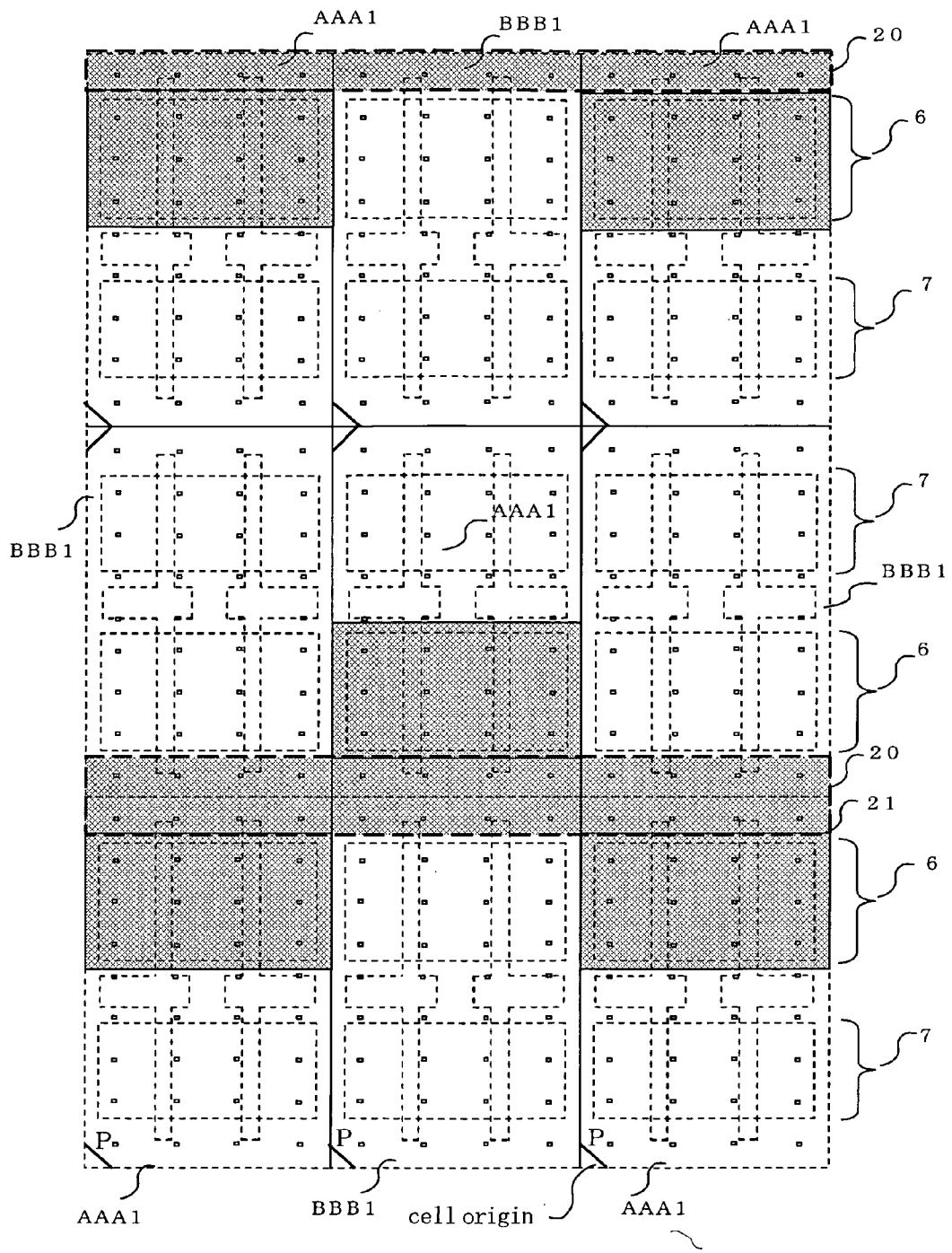
FIG. 16 is a plane view showing an ion implantation layer for a P-channel MOS transistor with a standard threshold voltage used in the chip of FIG. 15.
Figure 17:
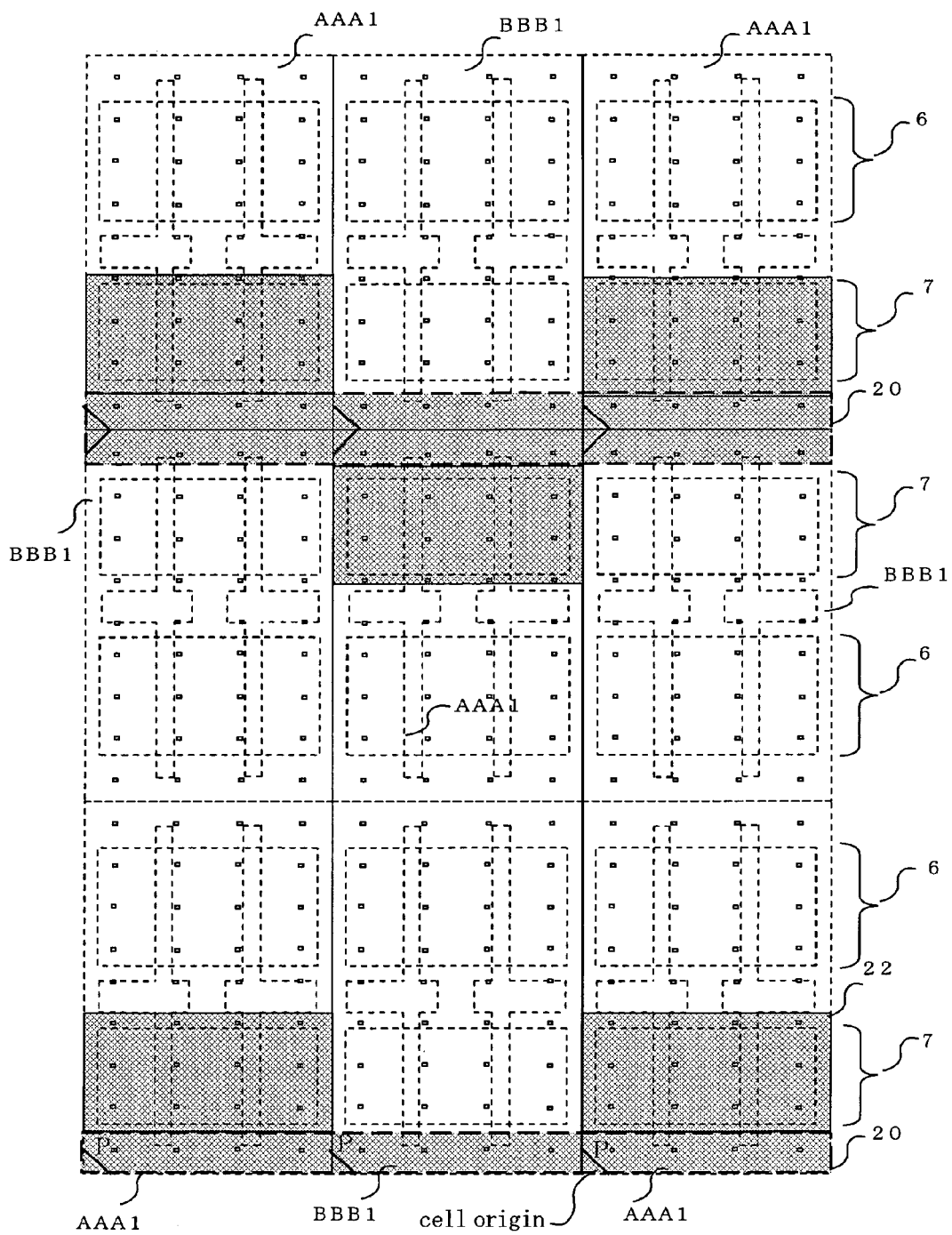
FIG. 17 is a plane view showing an ion implantation layer for a N-channel MOS transistor with a standard threshold voltage used in the chip of FIG. 15.
Figure 18:
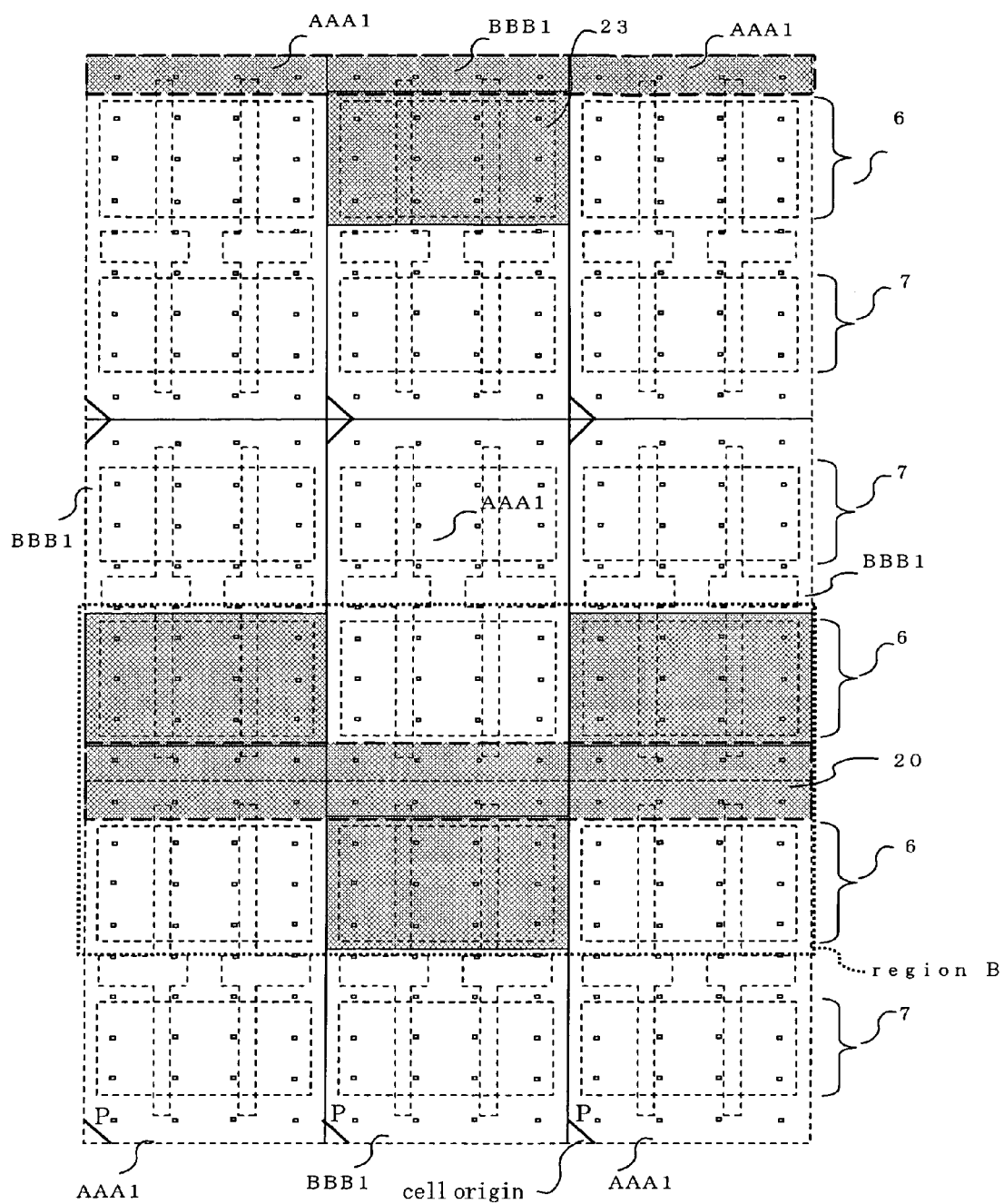
FIG. 18 is a plane view showing an ion implantation layer for a P-channel MOS transistor with a high threshold voltage used in the chip of FIG. 15.
Figure 19:
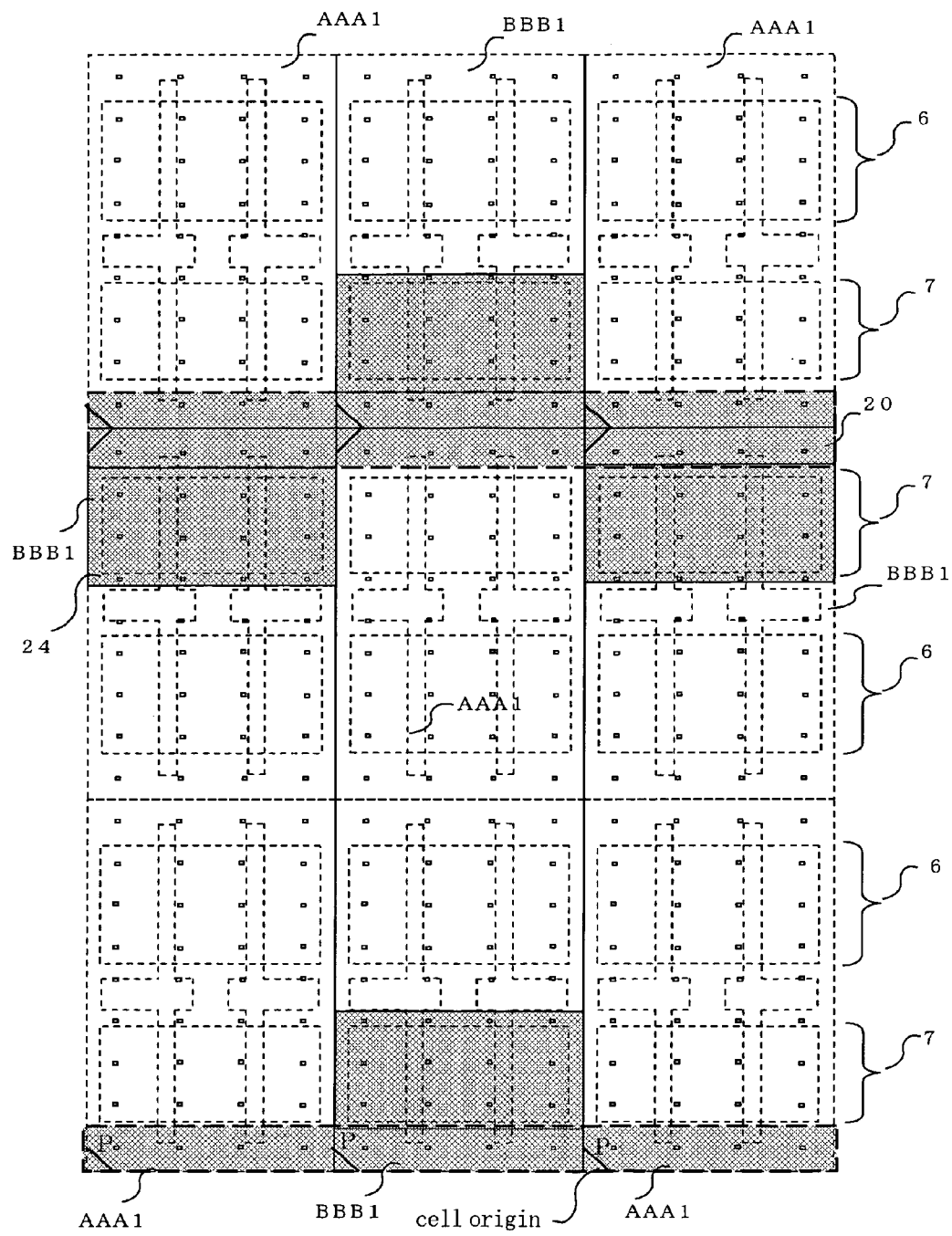
FIG. 19 is a plane view showing an ion implantation layer for a N-channel MOS transistor with a high threshold voltage used in the chip of FIG. 15.

FIG. 16 shows an ion implantation layer of P-channel MOS transistors for forming standard threshold voltage, FIG. 17 shows an ion implantation layer of N-channel MOS transistors for forming standard threshold voltage, FIG. 18 shows an ion implantation layer of P-channel MOS transistors for forming high threshold voltage, and FIG. 19 shows an ion implantation layer of N-channel MOS transistors for forming high threshold voltage. In addition, in region A, four high Vth cell BBB1(s) are placed at the cross.

As shown in FIG. 16, at an upper row part, standard Vth cell AAA1(s) and high Vth cell BBB1 are placed considering a lower left as an originr of each cell. At a middle row part, vertical reversed standard Vth cell AAA1 and vertical reversed high Vth cell BBB1(s) are placed considering an upper left as an originr of each cell. At a lower row part, standard Vth cell AAAL(s) and high Vth cell BBB1 are placed considering a lower left as an originr of each cell.

The ion implantation layer of P-channel MOS transistors for forming standard threshold voltage includes common ion implantation region 20 being used in several ion implantation processes, and channel ion implantation region 21 of P-channel MOS transistor region 6 in standard Vth cell AAA1.

As shown in FIG. 17, the ion implantation layer of N-channel MOS transistors for forming standard threshold voltage includes common ion implantation region 20 being used in several ion implantation processes, and channel ion implantation region 22 of N-channel MOS transistor region 7 in standard Vth cell AAA1.

As shown in FIG. 18, the ion implantation layer of P-channel MOS transistors for forming high threshold voltage includes common ion implantation region 20 being used in several ion implantation processes, and channel ion implantation region 23 of P-channel MOS transistor region 6 in high Vth cell BBB1.

As shown in FIG. 19, the ion implantation layer of N-channel MOS transistors for forming high threshold voltage includes common ion implantation region 20 being used in several ion implantation processes, and channel ion implantation region 24 of N-channel MOS transistor region 7 in high Vth cell BBB1.

Figure 20A:
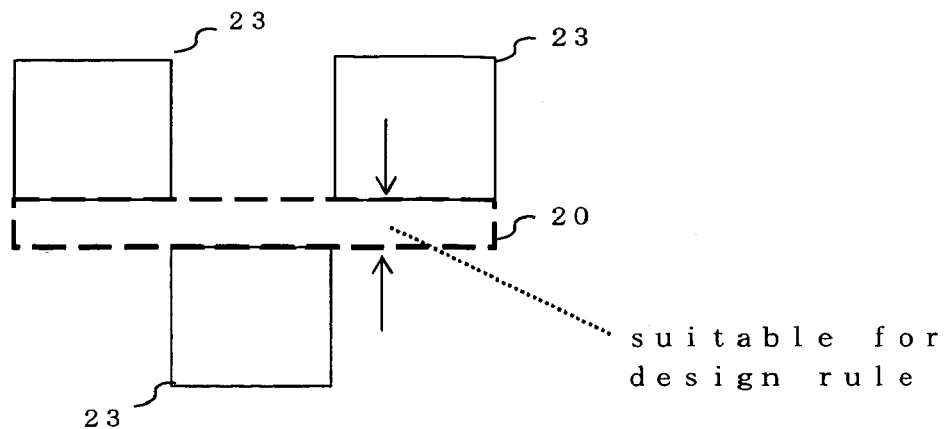
FIG. 20A shows a placement of the ion implantation layers in the LSI chip using the semiconductor device according to the fourth embodiment of the present invention.
Figure 20B:
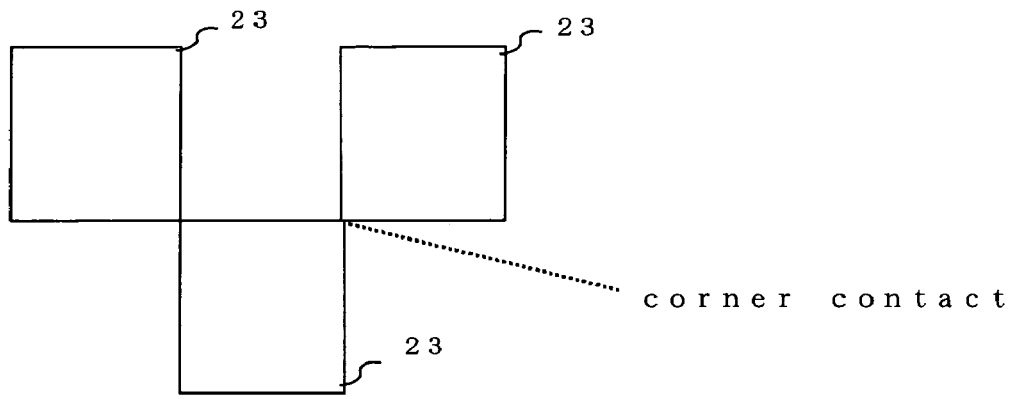
FIG. 20B and FIG. 20C show ion implantation layers in a conventional device.
Figure 20C:
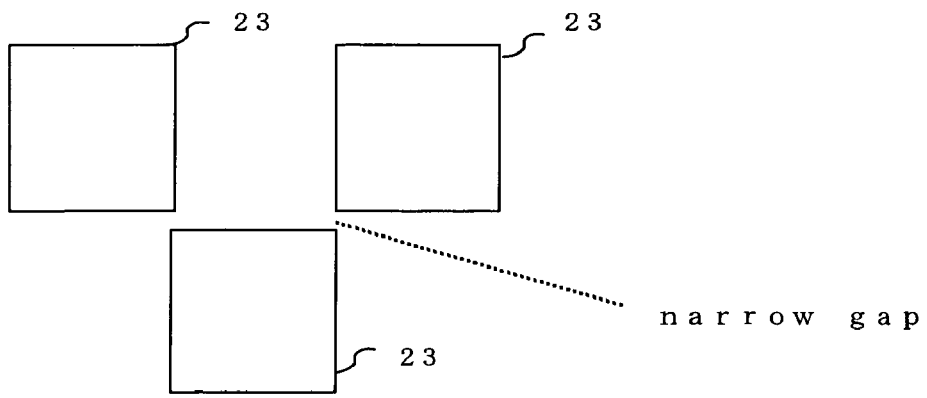

A gap between regions in the ion implantation layer of the chip of the semiconductor device will be explained with reference to a region B shown in FIG. 18. FIG. 20A, FIG. 20B and FIG. 20C are comparison figures showing a gap between regions in the ion implantation layer of the chip, FIG. 20A shows regions in the ion implantation layer of this embodiment, and FIG. 20B and FIG. 20C show regions in an ion implantation layer of a conventional design.

As clearly shown in this comparison figure, since the conventional design does not have common ion implantation region 20, high Vth P-channel MOS transistor channel ion implantation regions 23 contact at their corners, or they are placed at narrow gap below design rule. Therefore, violation of design rule occurs at the time of layout design or mask creation. On the other hand, in the embodiment of the present invention, since common ion implantation region 20 which has the size more than design rule is formed between high Vth P-channel MOS transistor ion implantation regions 23, violation of design rule does not occur.

In above mentioned embodiment, high Vh cells BBB1 and BBB2 are prepared for reducing consumption current, it is also possible to prepare low Vth cells which include P-channel MOS transistors whose threshold voltage are about −0.2V, and N-channel MOS transistors whose threshold voltage are about 0.2V for high speed performance. Furthermore, it may be possible to prepare both high Vh cells and low Vth cells in the master slice semiconductor integrated circuit.

Since common ion implantation regions 20 are put in the master slice semiconductor integrated circuit of this embodiment as mentioned above, high Vth cells and low Vth cells can be freely placed in the chip instead of standard Vth cells.

Therefore, forming a part of circuit into low power consumption by using high Vth cells or forming a part of circuit into high speed operation by using low Vth cells can carry out freely without restriction of cell placement design.

This invention is not limited to the above-mentioned embodiments, is a range which does not deviate from a meaning of invention, and may be changed variously.

For example, in the fourth embodiment, although applied to the master slice semiconductor integrated circuit, it is applicable also to a general logic LSI or a logic portion of an analog digital mixed LSI.

What is claimed is:

1. A semiconductor device including arrays of basic cells, each basic cell comprising:
a source region;
a drain region;
a pair of gate electrodes;
a source/drain region formed between the gate electrodes;
a first contact area placed in the source region;
a second contact area placed in the drain region;
a third contact area placed in the each gate electrode;
a fourth contact area placed in the source/drain region;
a first wiring portion on a first wiring layer connected to the first contact area as a source terminal of a transistor, including a plurality of prospective grid points arranged in the direction of height of the cell, the plurality of prospective grid points corresponding to wiring grids for layout design and a via contact area can be placed on the each prospective grid point;
a second wiring portion on the first wiring layer connected to the second contact area as a drain terminal of the transistor, including the plurality of prospective grid points arranged in the direction of height of the cell;
a third wiring portion on the first wiring layer connected to the third contact area as a gate, terminal of the transistor, including the plurality of prospective grid points arranged in the height and width directions of the cell; and
a fourth wiring portion on the first wiring layer connected to the fourth contact area as a source/drain terminal of the transistor, including the plurality of prospective grid points arranged in the height and width directions of the cell.

2. A semiconductor device according to claim 1 including an external wiring connected to the terminal of the basic cell being wired on the wiring grids.

3. A semiconductor device according to claim 1 including arrays of sequential circuits constituted by the basic cells, and arrays of gate circuits constituted by the basic cells, wherein each array of the sequential circuits and each array of the gate circuits are alternatively placed.

4. A semiconductor device according to claim 3, wherein one of the basic cells having a first threshold voltage, and another one of the basic cells having a second threshold voltage which is different from the first threshold voltage, the each basic cell can be freely placed in the array of the sequential circuit or the array of the gate circuit.

5. A semiconductor device according to claim 4, wherein the each basic cell includes a common ion implantation region being used in several ion implantation processes, being linked with a channel ion implantation region which is used for controlling a threshold voltage of the transistor.

* * * * *